(12) United States Patent
Felnhofer et al.

(10) Patent No.: US 7,729,036 B2
(45) Date of Patent: Jun. 1, 2010

(54) CAPACITIVE MEMS DEVICE WITH PROGRAMMABLE OFFSET VOLTAGE CONTROL

(75) Inventors: Daniel Felnhofer, San Jose, CA (US); Evgeni Gousev, Saratoga, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 158 days.

(21) Appl. No.: 11/938,673

(22) Filed: Nov. 12, 2007

(65) Prior Publication Data

US 2009/0122384 A1 May 14, 2009

(51) Int. Cl.
*G02B 26/00* (2006.01)
*G02B 26/02* (2006.01)

(52) U.S. Cl. ..................... 359/290; 359/230

(58) Field of Classification Search .................. 359/198, 359/230, 231, 290, 291, 315, 198.1
See application file for complete search history.

(56) References Cited

U.S. PATENT DOCUMENTS

| | | | |
|---|---|---|---|
| 4,954,789 A | 9/1990 | Sampsell | |
| 5,784,189 A | 7/1998 | Bozler et al. | |
| 5,838,484 A | 11/1998 | Goossen | |
| 5,966,235 A | 10/1999 | Walker et al. | |
| 6,040,937 A | 3/2000 | Miles | |
| 6,574,033 B1 | 6/2003 | Chui et al. | |
| 6,657,832 B2 | 12/2003 | Williams et al. | |
| 6,674,562 B1 | 1/2004 | Miles et al. | |
| 6,680,792 B2 | 1/2004 | Miles | |
| 7,123,216 B1 | 10/2006 | Miles | |
| 7,136,213 B2 | 11/2006 | Chui | |

(Continued)

FOREIGN PATENT DOCUMENTS

WO  WO 2004/026757  4/2004

OTHER PUBLICATIONS

International Search Report and Written Opinion dated Mar. 19, 2009 for PCT Application No. PCT/US2008/082894.

(Continued)

*Primary Examiner*—William C Choi
(74) *Attorney, Agent, or Firm*—Knobbe Martens Olson & Bear LLP

(57) ABSTRACT

A capacitive MEMS device is formed having a material between electrodes that traps and retains charges. The material can be realized in several configurations. It can be a multilayer dielectric stack with regions of different band gap energies or band energy levels. The dielectric materials can be trappy itself, i.e. when defects or trap sites are pre-fabricated in the material. Another configuration involves a thin layer of a conductive material with the energy level in the forbidden gap of the dielectric layer. The device may be programmed (i.e. offset and threshold voltages pre-set) by a method making advantageous use of charge storage in the material, wherein the interferometric modulator is pre-charged in such a way that the hysteresis curve shifts, and the actuation voltage threshold of the modulator is significantly lowered. During programming phase, charge transfer between the electrodes and the materials can be performed by applying voltage to the electrodes (i.e. applying electrical field across the material) or by UV-illumination and injection of electrical charges over the energy barrier. The interferometric modulator may then be retained in an actuated state with a significantly lower actuation voltage, thereby saving power.

68 Claims, 16 Drawing Sheets

U.S. PATENT DOCUMENTS

| | | |
|---|---|---|
| 7,161,728 B2 | 1/2007 | Sampsell et al. |
| 2002/0015215 A1 | 2/2002 | Miles |
| 2002/0036304 A1 | 3/2002 | Ehmke et al. |
| 2004/0026757 A1 | 2/2004 | Crane et al. |
| 2004/0051929 A1 | 3/2004 | Sampsell et al. |
| 2004/0058532 A1 | 3/2004 | Miles et al. |
| 2005/0012577 A1 | 1/2005 | Pillans et al. |
| 2006/0049826 A1 | 3/2006 | Daneman et al. |
| 2006/0066935 A1 | 3/2006 | Cummings et al. |
| 2006/0109539 A1 | 5/2006 | Katoh et al. |
| 2006/0187522 A1 | 8/2006 | Jilani et al. |
| 2007/0041079 A1 | 2/2007 | Chui |

OTHER PUBLICATIONS

Miles, MEMS-based interferometric modulator for display applications, Part of the SPIE Conference on Micromachined Devices and Components, vol. 3876, pp. 20-28 (1999).

Miles et al., 5.3: Digital Paper™: Reflective displays using interferometric modulation, SID Digest, vol. XXXI, 2000 pp. 32-35.

| | Column Output Signals | |
|---|---|---|
| | $+V_{bias}$ | $-V_{bias}$ |
| Row Output Signals  0 | Stable | Stable |
| $+\Delta V$ | Relax | Actuate |
| $-\Delta V$ | Actuate | Relax |

CAPACITIVE MEMS DEVICE WITH PROGRAMMABLE OFFSET VOLTAGE CONTROL

BACKGROUND

1. Field of the Invention

The field of the invention relates to microelectromechanical systems (MEMS).

2. Description of the Related Technology

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display and MEMS devices.

In one embodiment, a microelectromechanical (MEMS) device comprises an electrode, a material that readily traps charge coupled to the electrode, and a movable layer extending over the surface of the material so as to form a cavity therebetween. In this embodiment, the movable layer is configured to contact the material in response to an electrical potential between the electrode and at least a portion of the movable layer that is greater than an actuation threshold. When the movable layer contacts the material, charge is transferred between the movable layer or electrode and the material to significantly change the actuation threshold.

In some advantageous embodiments, the material comprises a multi-layer material stack comprising a first material and at least one other material that is a metal or has an electron energy band gap that is less than the electron energy band gap of the first material.

A method of addressing a microelectromechanical (MEMS) element is also provided. The method is applied to a device including a movable layer and a material comprising regions of different electron energy band gaps. The method includes actuating the MEMS element to move the movable layer toward the material and transferring charge to a region of low electron energy band gap in the material. In some embodiments, the MEMS element exhibits hysteresis, and the transferred charge is sufficient to shift a center of the hysteresis near zero volts.

In another embodiment, a method of manufacturing a microelectromechanical (MEMS) device includes forming an electrode, forming a material on the electrode, wherein the material comprises regions of different electron energy band gaps, and forming a movable layer over the material so as to establish a cavity therebetween. The movable layer is configured to contact the material in response to an electrical potential between the electrode and at least a portion of the movable layer that is greater than an actuation threshold.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Some displays can be made from elements which are addressed with the unique scheme discussed below. When the display elements have a substantial charge persistence characteristic the elements may be pre-charged in a write operation, displayed with a voltage lower than would otherwise be needed in a display operation, and finally cleared in a clear operation in preparation for a subsequent write operation. The scheme is particularly useful for lower power operation.

Figure 1:
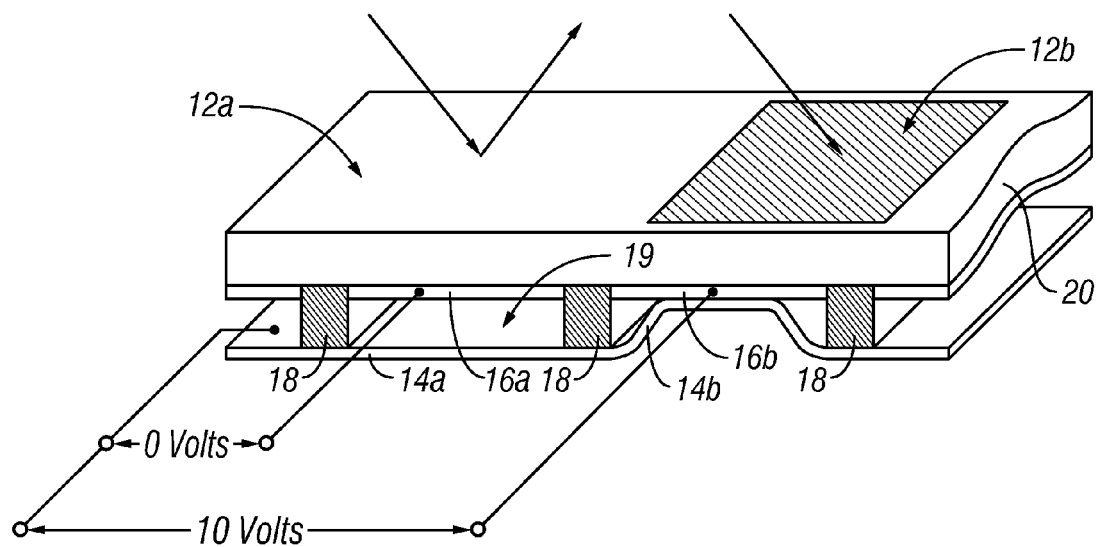
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
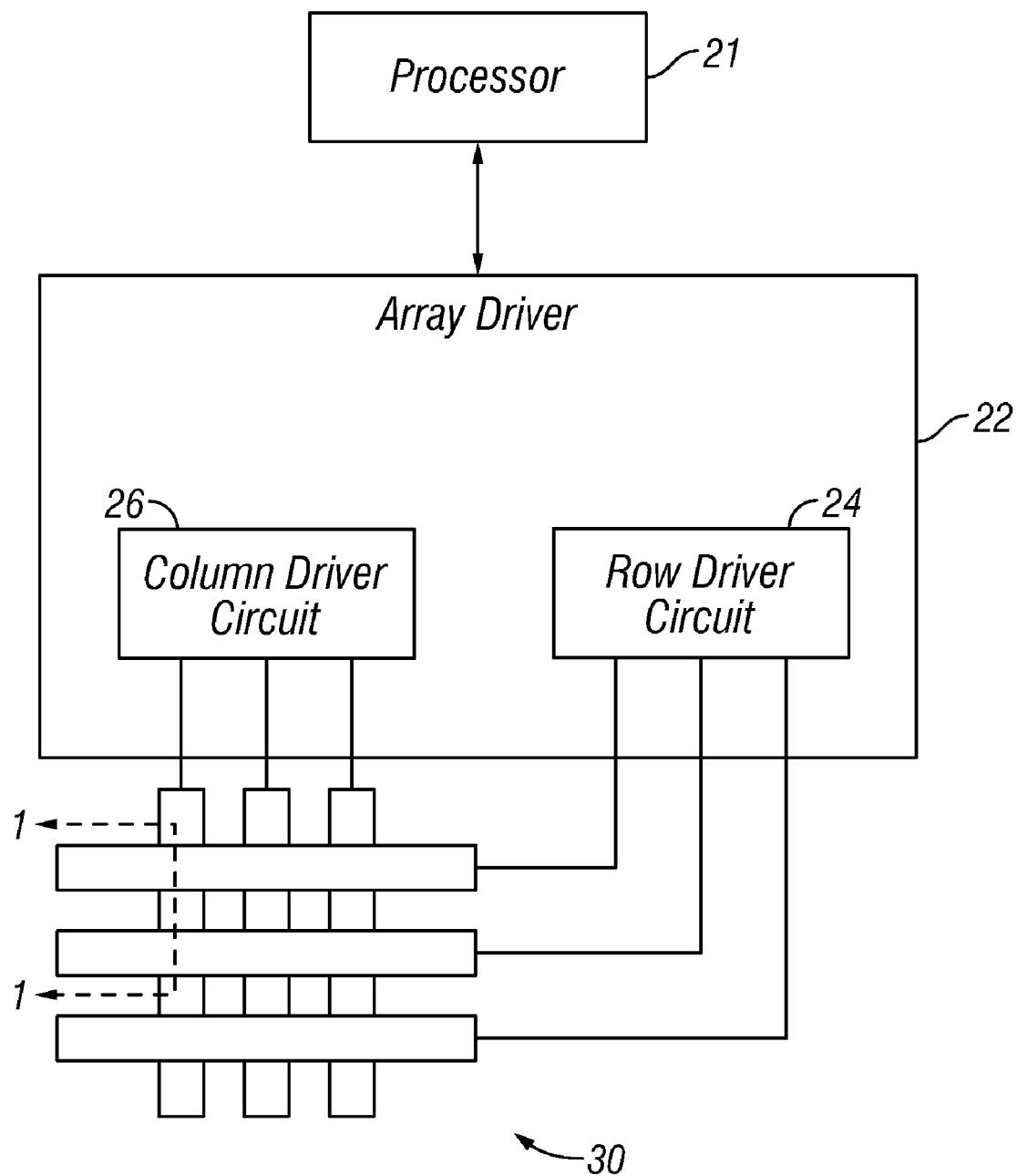
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window."

Figures 3, 4:
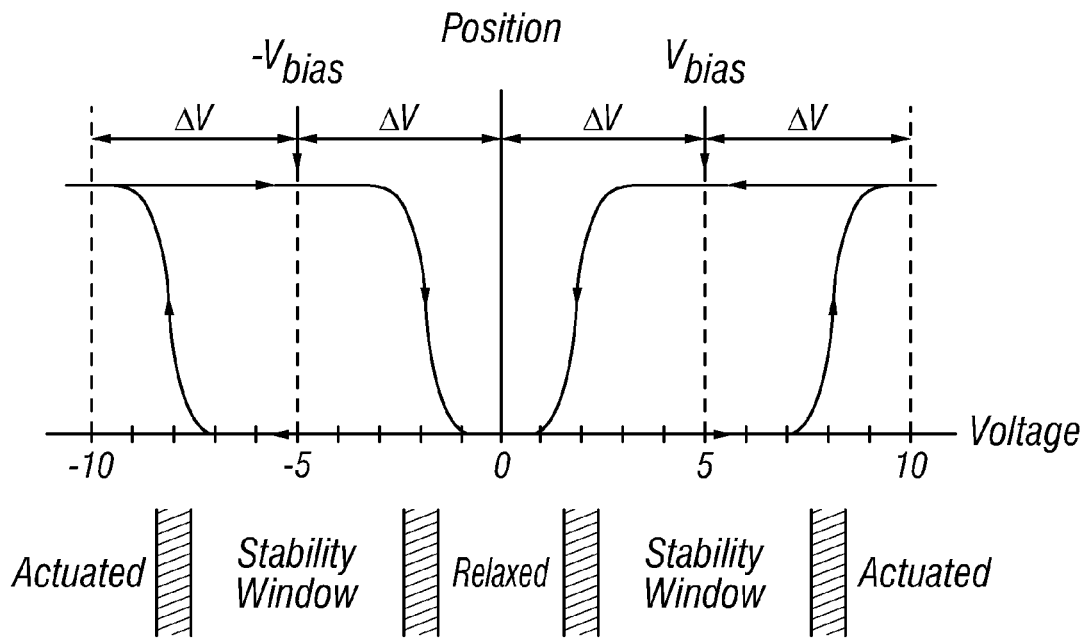
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
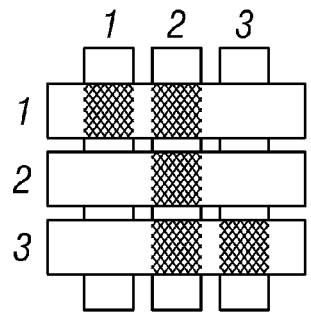
FIGS. 5A and 5B illustrate one exemplary timing diagram for row and column signals that may be used to write a frame of display data to the 3×3 interferometric modulator display of FIG. 2.
Figure 5B:
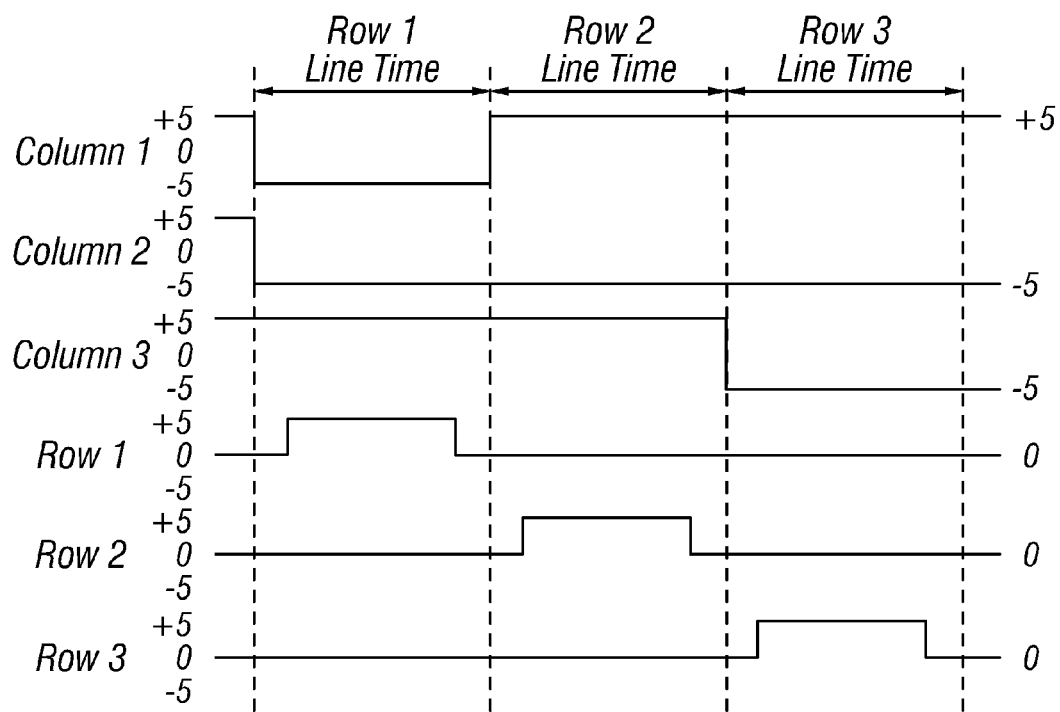

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels ( 1,1 ), ( 1,2 ), ( 2,2 ), ( 3,2 ) and ( 3,3 ) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the ( 1,1 ) and ( 1,2 ) pixels and relaxes the ( 1,3 ) pixel. No other pixels in the array are affected. To set row 2 as desired, column 2 is set to −5 volts, and columns 1 and 3 are set to +5 volts. The same strobe applied to row 2 will then actuate pixel ( 2,2 ) and relax pixels ( 2,1 ) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
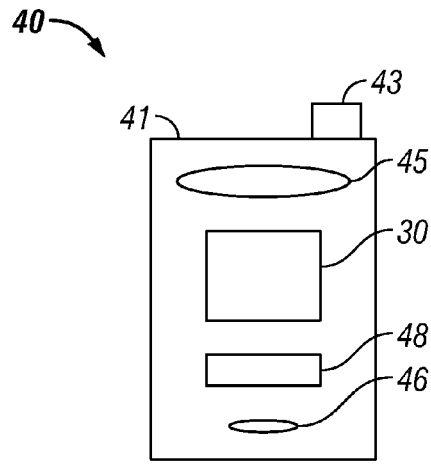
FIGS. 6A and 6B are system block diagrams illustrating an embodiment of a visual display device comprising a plurality of interferometric modulators.
Figure 6B:
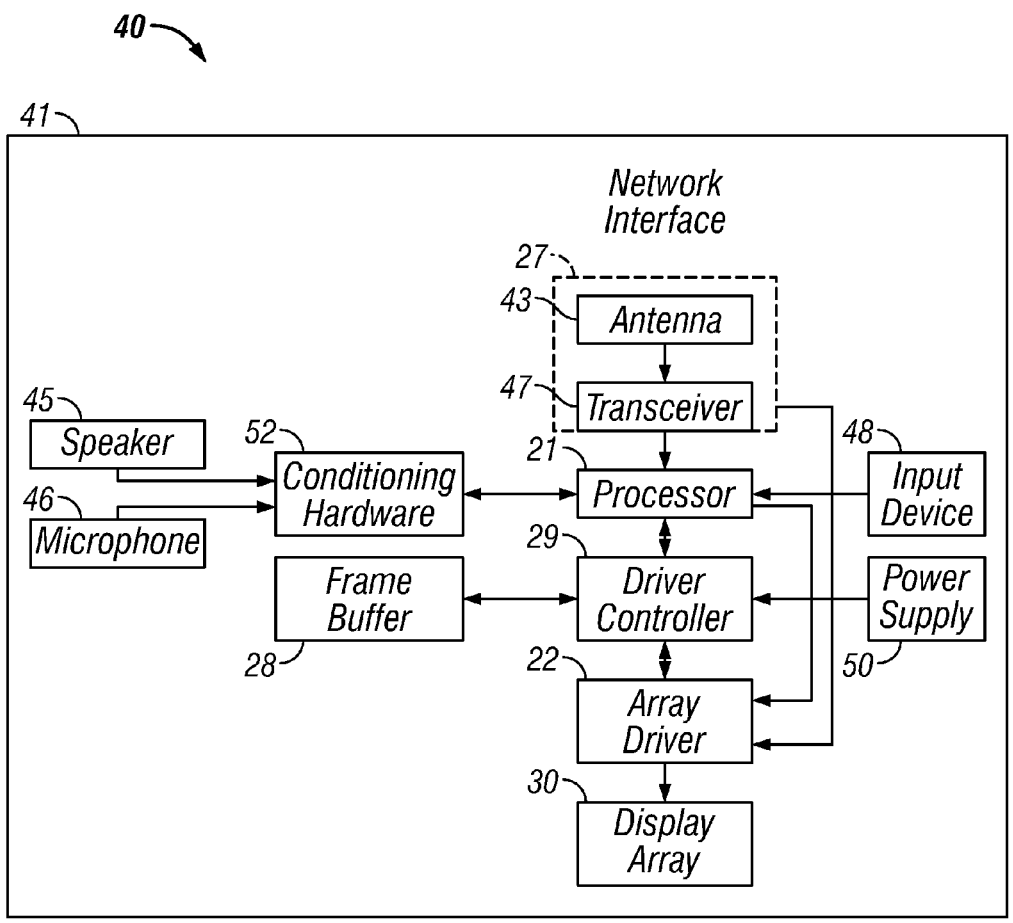

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
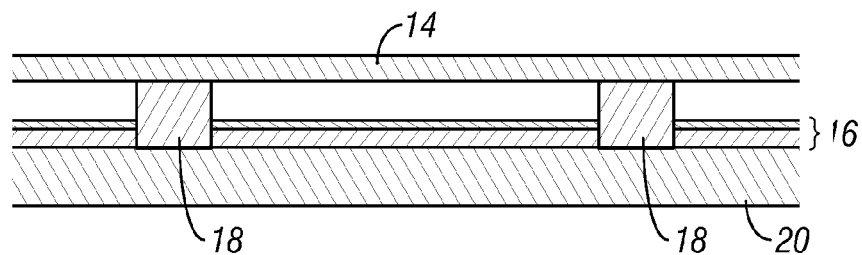
FIG. 7A is a cross section of the device of FIG. 1.
Figure 7B:
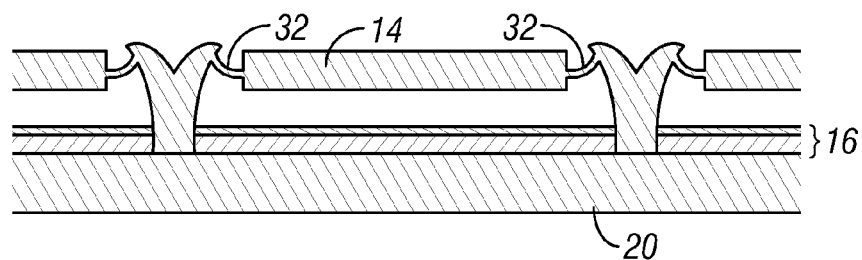
FIG. 7B is a cross section of an alternative embodiment of an interferometric modulator.
Figure 7C:
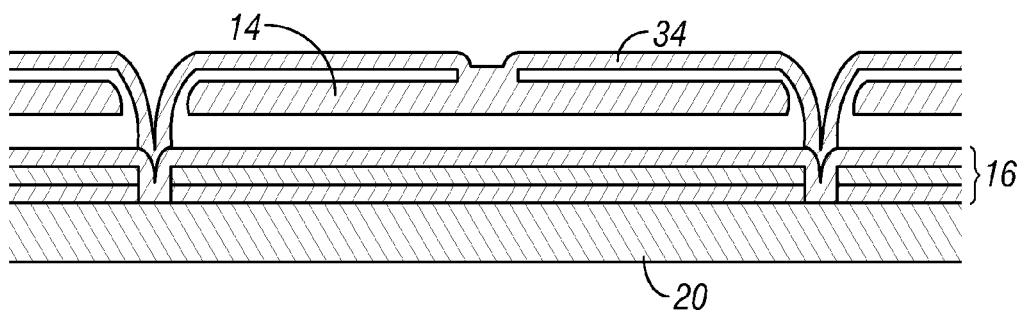
FIG. 7C is a cross section of another alternative embodiment of an interferometric modulator.
Figure 7D:
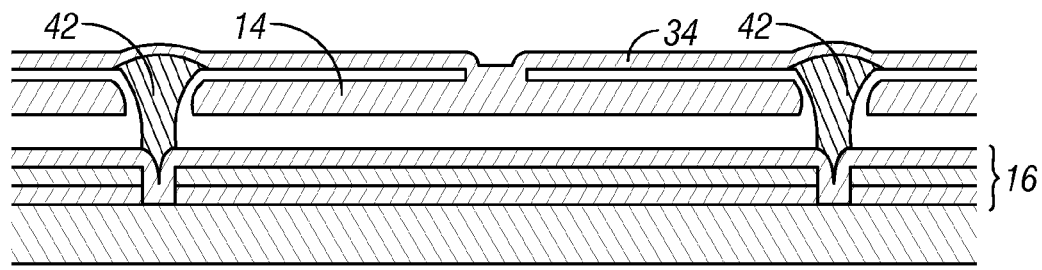
FIG. 7D is a cross section of yet another alternative embodiment of an interferometric modulator.
Figure 7E:
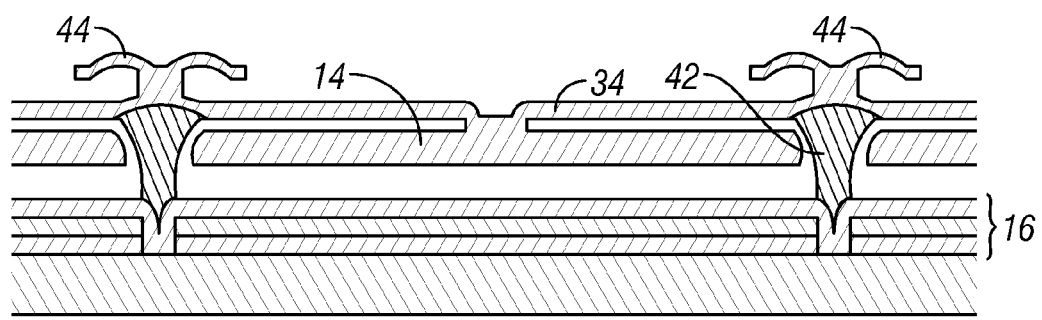
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The capacitance-voltage response of a typical capacitive MEMS device, which is similar to FIG. 3, is symmetrical around zero applied bias, assuming no fixed charge is present within the structure. The fact that the hysteresis window is not centered on zero applied bias requires that a non-zero bias be applied to the device at all times to keep the movable layer actuated, which has several drawbacks. First, the application of a non-zero bias to a capacitive device has the potential of shifting the hysteresis window due to undesired charging of a dielectric stack of the device. This requires additional compensation by the controlling circuitry. In the case of the interferometric modulator displays, the additional driver complexity to implement charge-balancing waveforms (e.g., toggling applies biases between the positive and negative hysteresis windows instead of applying a DC holding bias at one polarity) is costly. Secondly, driving a device with a bias will have greater power dissipation. For these reasons, it is desirable if the center of the hysteresis window is shifted to zero bias. Certain embodiments as will be described below provide a programmable offset voltage control capability, which enables charge to be stored in the dielectric stack of an interferometric modulator in a controlled manner and therefore shift the center of the hysteresis window to zero bias. These embodiments are not limited to an interferometric modulator, but can be applicable to any capacitive MEMS device with an air gap between two electrodes, such as a MEMS switch.

Figure 8A:
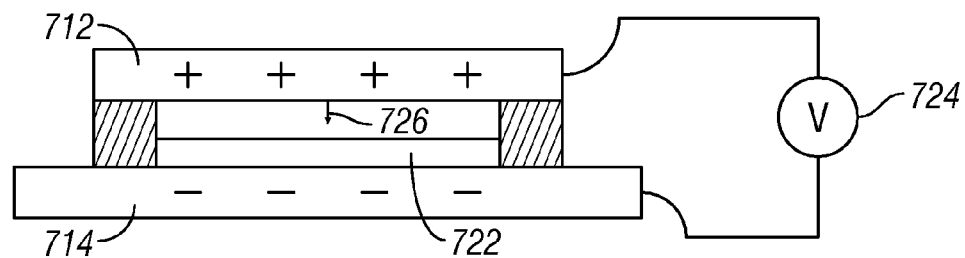
FIGS. 8A, 8B, and 8C are schematic side views of an interferometric modulator illustrating the process of embedding a charge in the dielectric layer of the interferometric modulator.
Figure 8B:
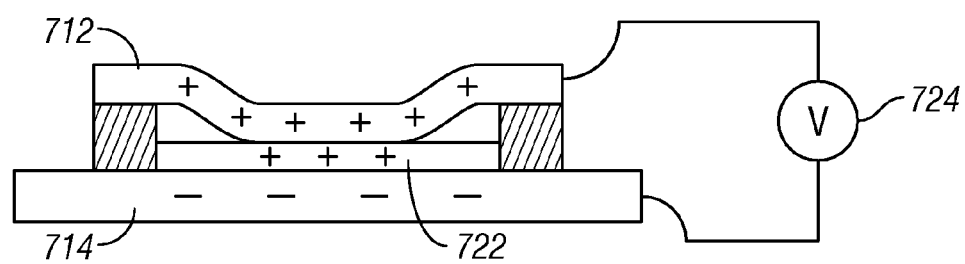
Figure 8C:
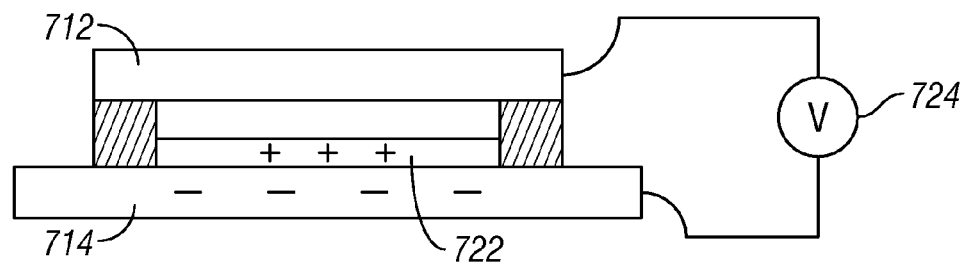

FIGS. 8A, 8B, and 8C show a side cross-sectional view of an interferometric modulator with structure similar to the device shown in FIG. 7A. These figures illustrate the application of a voltage from the voltage source 724 across the reflective layer 712 and the optical stack 714. In FIG. 8B, the reflective layer 712 is illustrated in its deformed state, where it is drawn closer to the optical stack 722 by an electrostatic force 726 produced by the applied voltage. As shown in FIG. 8B, as reflective layer 712 contacts or becomes sufficiently close to the dielectric stack 722, it transfers electrical charge to the dielectric stack 722. FIG. 8C shows the device when the electrical potential induced by the voltage source 724 is removed or reduced such that the reflective layer 712 returns to its non-deformed state. However, it is also seen that the dielectric stack 722 still holds some or all of the electrical charge that was transferred to it when the reflective layer 712 was deformed and brought into contact or near contact with the dielectric stack. As shown in FIG. 8C, the transferred charge is a positive charge or "potential." This potential will typically persist in the dielectric stack for greater than at least 100 ms or until an opposite potential is applied between the reflective layer 712 and the optical stack 722. This occurs when the reflective layer 712 deforms into the cavity and delivers a negative potential to the dielectric stack 722.

The property by which the dielectric stack holds the potential can be referred to as "charge persistence." When a dielectric stack is holding a potential, that potential may be referred to as an "embedded potential" or an "embedded charge." The description herein of an embedded potential that happens to be positive is not intended to suggest that embodiments using opposite polarity are disfavored. Indeed, in some embodiments opposite polarities are used. In some embodiments both polarities may be used.

Figure 9:
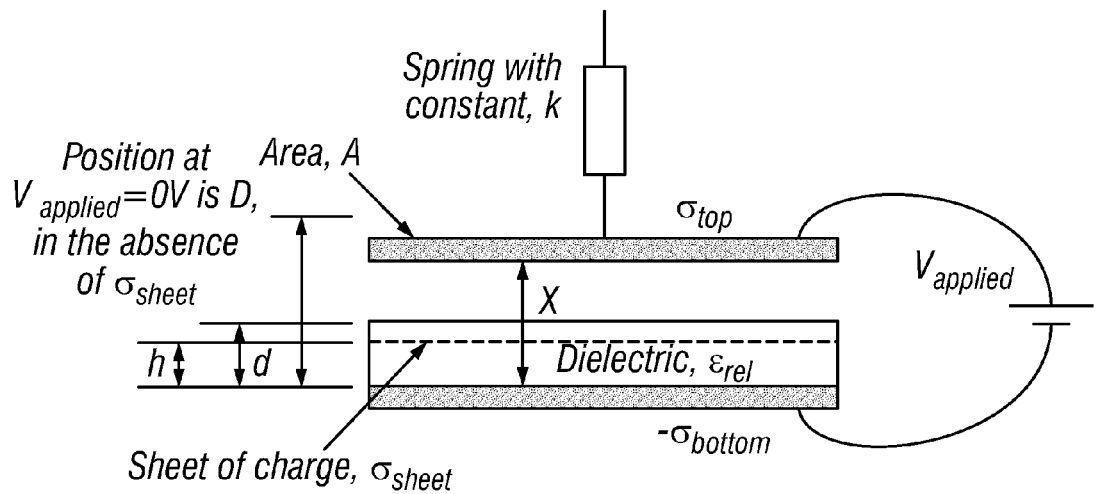
FIG. 9 illustrates a simplified parallel plate capacitor model for a capacitive MEMS device.
Figure 10:
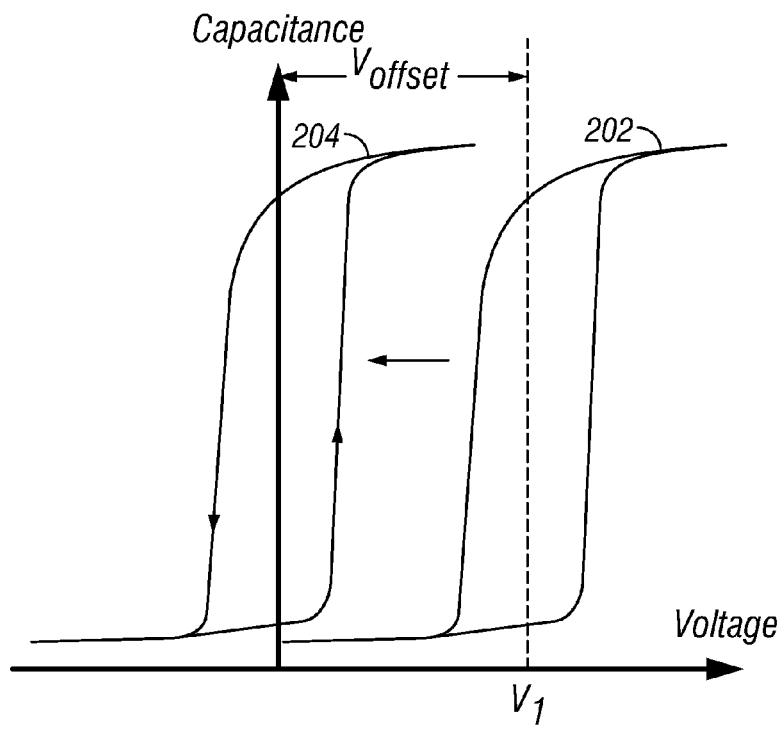
FIG. 10 illustrates the shift of the hysteresis window of an interferometric modulator controlled by a charge stored within the dielectric.

Embedded charge within the dielectric stack can shift the hysteresis window of a MEMS capacitive device. FIG. 9 illustrates a simplified parallel plate capacitor model for a capacitive MEMS device with a sheet of charge $\sigma_{sheet}$ within the dielectric at a distance h from the bottom electrode (the optical stack 714). The sheet of charge results in a shift in both the release and actuation voltages by an amount $v_{offset}$ which can be determined as follows:

$$V_{offset} = \frac{h \cdot \sigma_{sheet}}{\varepsilon_{rel} \cdot \varepsilon_0} \qquad \text{Equation 1}$$

where $\varepsilon_{rel}$ is the relative permittivity of the dielectric and $\varepsilon_0$ is the permittivity of free space. Because both the actuation and release voltages shift by the same offset voltage, the form of the hysteresis window stays intact. The shift of the hysteresis window can be controlled by varying the amount of charge stored within the dielectric. If an appropriate amount of charge is stored in the dielectric, the hysteresis window will be moved to be centered on zero bias as illustrated in FIG. 10. The sensitivity of the shift of the hysteresis window to the amount of charge stored within the dielectric can be adjusted in the design and manufacture stage by, for example, using different dielectric materials and adjusting the distance h.

In some embodiments interferometric modulators are manufactured with a single dielectric layer, such as silicon nitride, silicon dioxide, aluminum oxide, and/or titanium dioxide. Certain embodiments as will be described below have a dielectric stack comprising multiple dielectric layers. Certain embodiments can also include a dielectric stack comprising multiple dielectric layers and another material, such as a metal or semiconductor. The common feature for some embodiments is the ability to trap and store charge within the dielectric stack.

Figure 11:
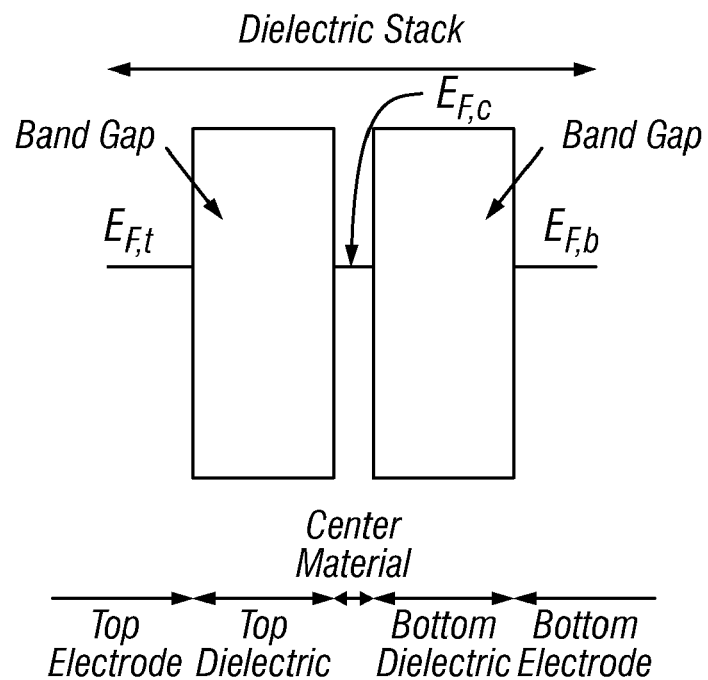
FIG. 11 illustrates the energy band for one embodiment of an interferometric modulator in an actuated state.

An Interferometric Modulator with a Dielectric Stack Capable of Trapping and Storing Charge FIG. 11 illustrates the energy band diagram for one embodiment of a multi-component insulating material stack between electrodes of an interferometric modulator. The material includes a center material located between two dielectrics. The center material may form a continuous film within the dielectric, or a non-continuous film such as islands of material. In FIG. 11, the band gap for a dielectric represents the gap between the bottom of a conduction band and the top of a valence band. $E_{F,t}$, $E_{F,c}$, and $E_{F,b}$ represent the Fermi level for the top electrode, the center material, and the bottom electrode respectively. Fermi level indicates the energy level of the free electrons within a material. As illustrated, the center material may be a conductor or any material with an energy level below the conduction band of the dielectric. For example, the material could be metals, silicon, and germanium. Because the center material has an energy level below the conduction band of the neighboring dielectric, it is able to trap charge.

Figure 12:
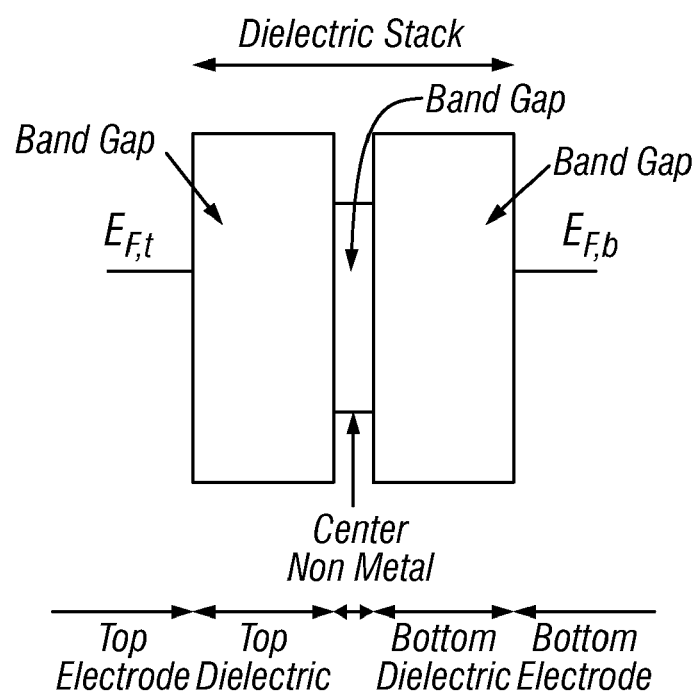
FIG. 12 illustrates the energy band for another embodiment of an interferometric modulator in an actuated state.

FIG. 12 illustrates the energy band diagram for another embodiment of a multi-component insulating material stack between electrodes of an interferometric modulator. The material includes a center material located between two dielectrics. The center material includes one or more additional dielectric materials. For example, the top and the bottom dielectric layers may be made of $SiO_2$ while the center material includes any other transition or rare-earth metal oxides, silicates, or nitrides, such as aluminum oxide, hafnium dioxide, or silicon nitride.

In one such embodiment, the dielectric stack forms a potential well capable of trapping and holding charge carriers. As illustrated, the center material may have a bottom of the conduction band lower than the neighboring dielectric layers, forming a potential well for electrons. The center material may have a top of the valence band higher than the neighboring dielectric, forming a potential well for holes.

In another embodiment, the center material can be made to have intrinsic or extrinsic defects using techniques known by those skilled in the art so that charge is readily trapped. In other embodiments, the center material may both form a potential well for charge carriers and be made to have defects for trapping charge.

Figure 13:
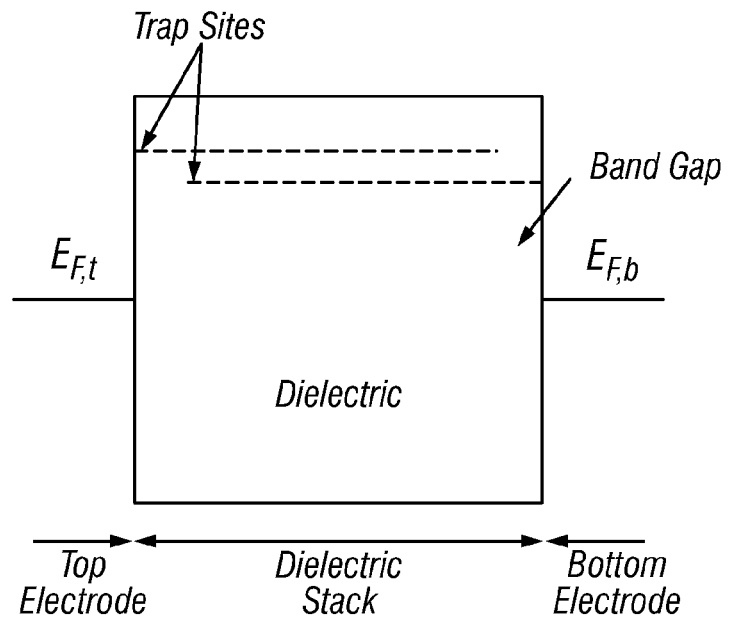
FIG. 13 illustrates the energy band for another embodiment of an interferometric modulator in an actuated state.

FIG. 13 illustrates the energy band diagram for another embodiment wherein a single layer of dielectric material is capable of holding charge because of intrinsic and/or extrinsic defects. The dielectric layer may include process induced defects, which are formed during the deposition or growth of the dielectric layer and are distributed throughout the dielectric layer as illustrated in FIG. 13. The dielectric layer may include intentionally introduced charge sites at a particular depth within the dielectric layer, such as implantation of dopant atoms. The dielectric layer may include both process induced defects and the intentionally introduced charge sites. The dielectric layer may include, for example, $SiN_x$, where x is an integer greater than zero.

Different approaches as discussed above may be combined to make a dielectric stack more effective at trapping and storing charge, though trapping electrons in a potential well formed by an intermediate metal or dielectric is generally more efficient and controllable than trapping electrons in defect sites. As illustrated above, a dielectric stack may include a charging layer located between a top electric and a bottom electric. In one embodiment, the thickness of the top dielectric and the bottom dielectric are from 50 to 1000 Å while the thickness of the charge trapping layer is from 2 to 200 Å. The dielectric may include only a single dielectric layer if the dielectric layer provides desired charge storage capacity. Depending on the design, more dielectric or charging layers may also be added.

Figure 14:
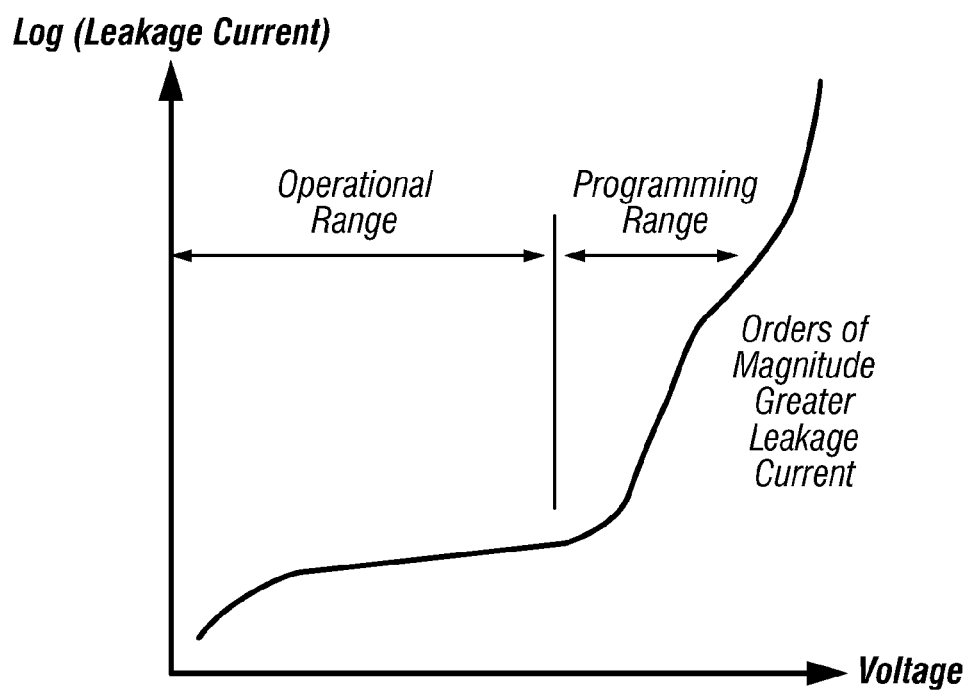
FIG. 14 illustrates two regimes of operation of an interferometric modulator.

Generally, the MEMS capacitive devices as described above have a relative thick dielectric layer, e.g., thicker than about 50 Å, which minimizes leakage current due to direct tunneling of charge carriers through the dielectric. Such devices potentially have two regimes of operation as illustrated in FIG. 14. The device operates in the normal operational regime when relatively low bias is applied across the two electrodes such that the device is either actuated or released. Very little leakage current occurs in the normal operational regime. Therefore, the charge stored within the device is unable to leak off at an appreciable rate. The device moves into the programming regime when a significantly higher bias is applied to program the device, e.g., to store charge in the charge trapping layer to move the hysteresis window. The higher biases result in high electric fields across the dielectric stack to produce Fowler-Nordheim tunneling current, which typically occurs for $SiO_2$ at applied fields greater than 4 MV/cm. The Fowler-Nordheim tunneling regime results in leakage current that is exponentially dependent on the applied field and therefore sufficient to provide a significant amount of charge to the dielectric stack for trapping.

Figure 15:
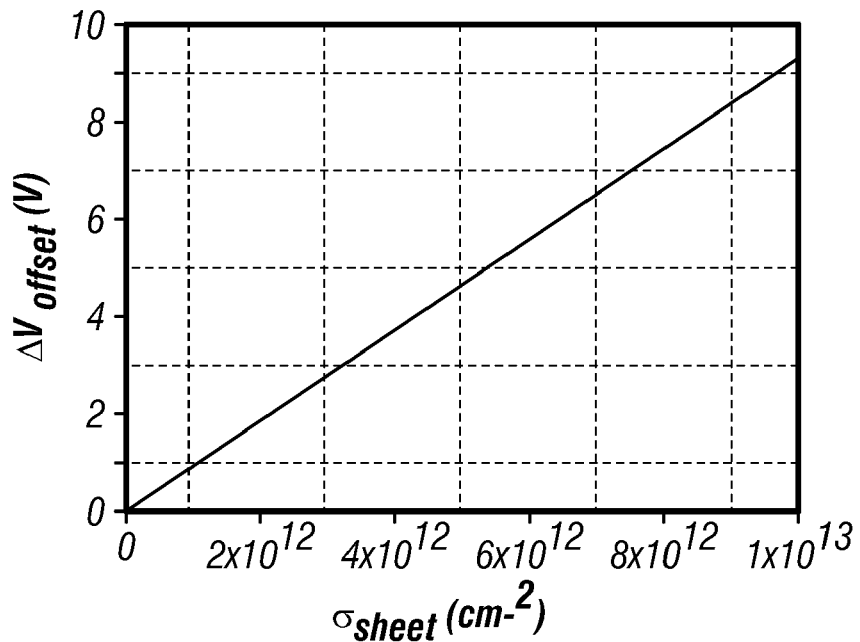
FIG. 15 is an exemplary diagram illustrating the voltage shift of an interferometric modulator as a function of a sheet of charge located at a distance of about 200 A from the bottom electrode.

The time required to program the device depends on the quantity of charge needed to provide the desired shift of the hysteresis window and the flow of charge to and from the storage medium (e.g., the leakage current) at the programming voltage. The quantity of charge needed to provide a desired voltage shift of the hysteresis window may be determined based on Equation 1. FIG. 15 is an exemplary diagram illustrating the voltage shift of an interferometric modulator as a function of a sheet of charge located at a distance of 200 Å from the bottom electrode.

Figure 16:
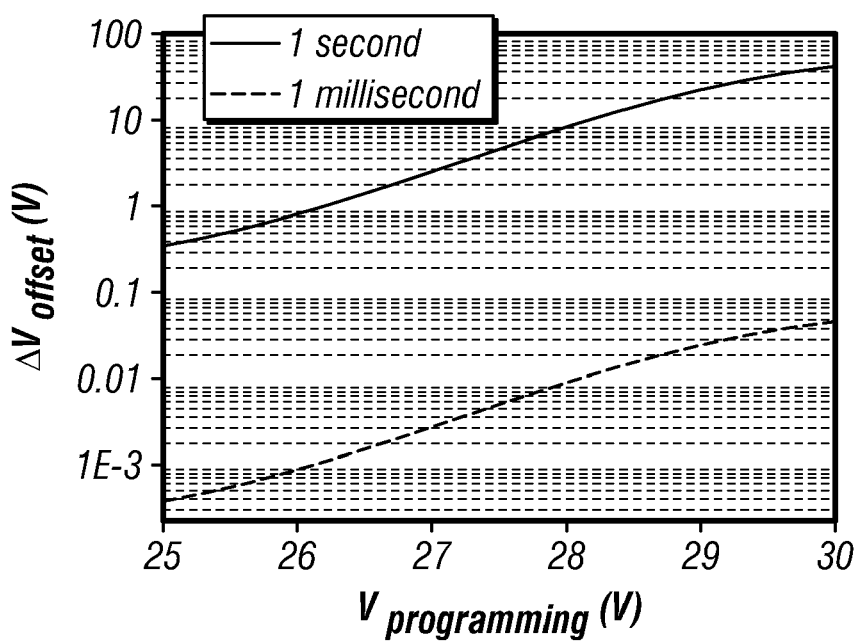
FIG. 16 is an exemplary diagram illustrating the desired voltage shift of the hysteresis window as a function of programming voltages.
Figure 17A:
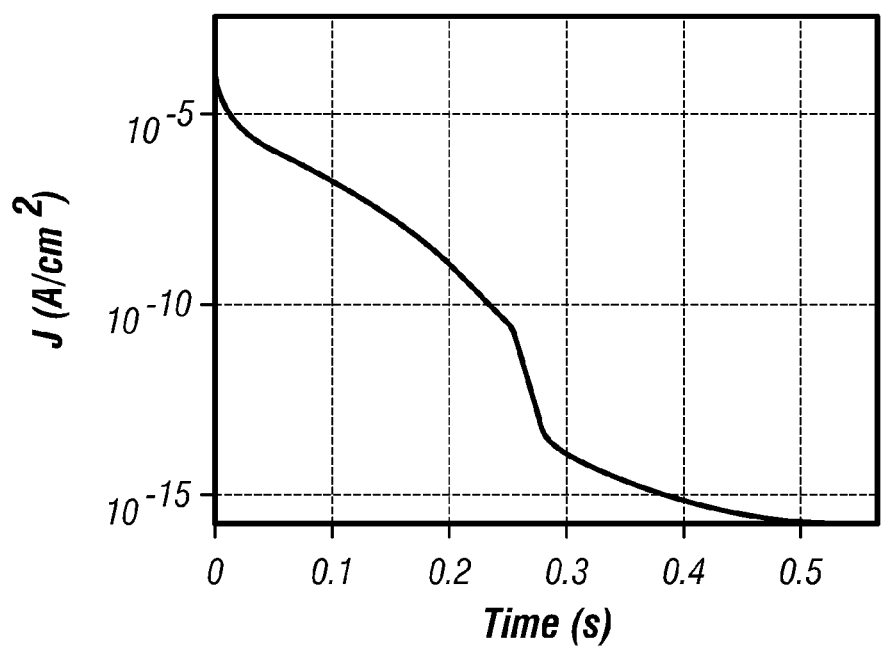
FIG. 17A-D illustrates an electrostatic programming simulation of a potential structure for use as a programmable MEMS capacitor.
Figure 17B:
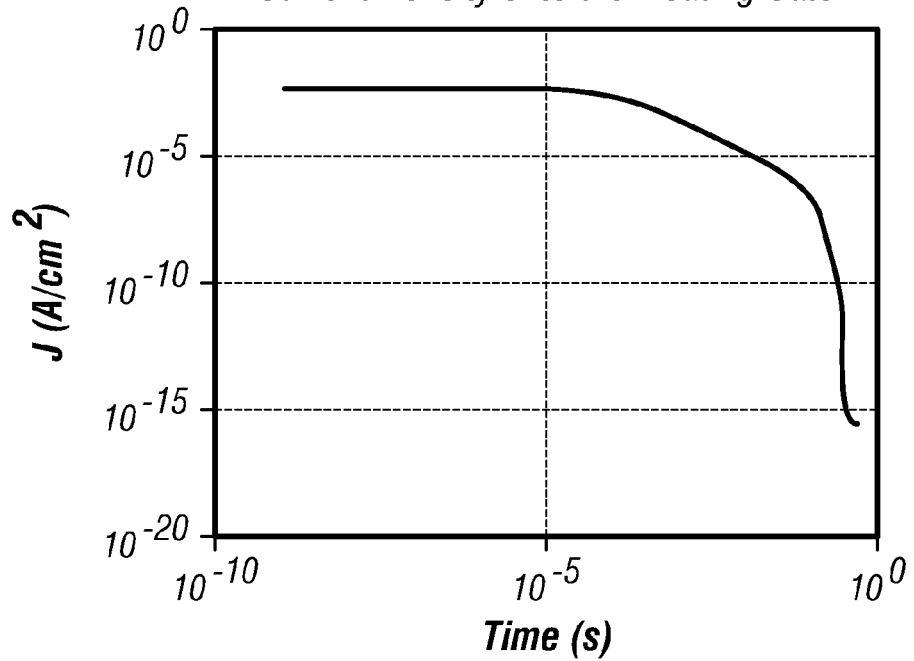
Figure 17C:
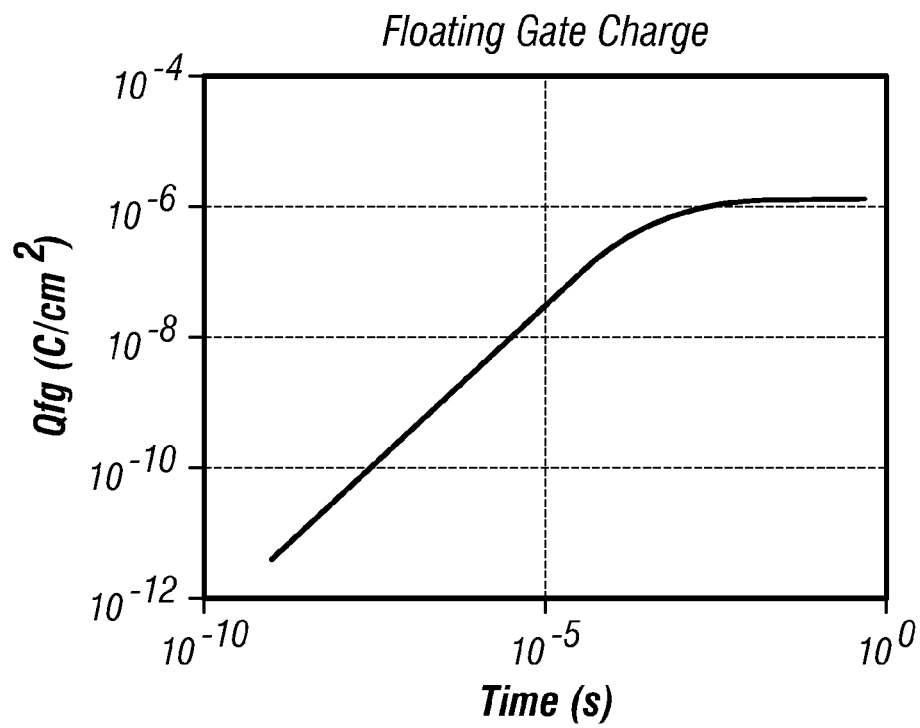
Figure 17D:
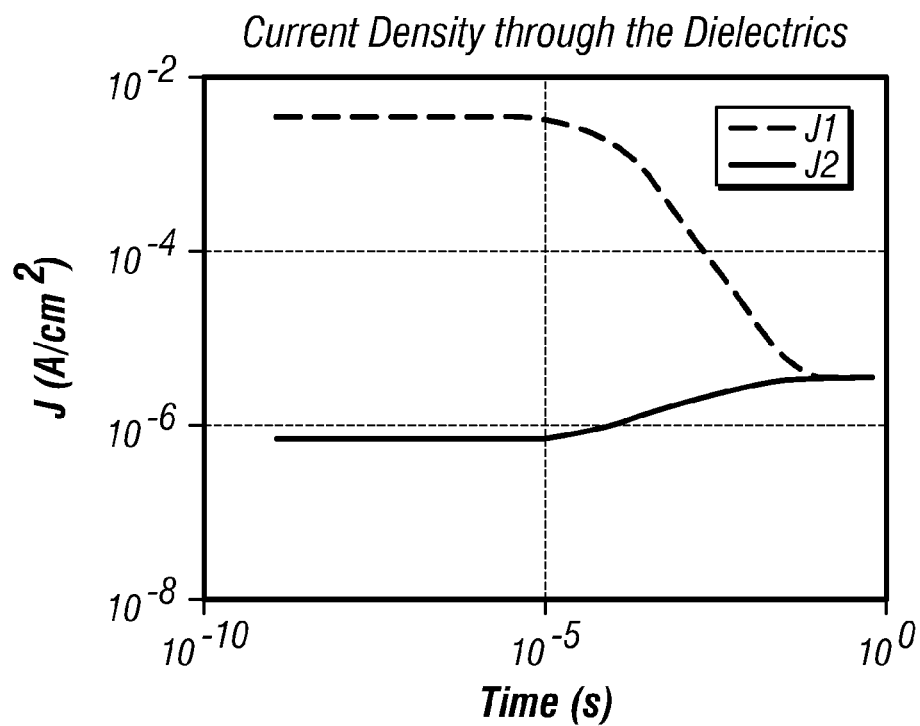

FIG. 16 is an exemplary diagram illustrating the desired voltage shift of the hysteresis window as a function of programming voltages. In this example, the leakage current through a 500 Å thick $SiO_2$ dielectric layer was used to determine, to the first order, the amount of voltage shift achievable due to the storage of charge within a capacitive device at a distance of 200 Å from the bottom electrode as a function of a programming voltage. Two programming times are shown, 1 second and 1 millisecond. This figure demonstrates the feasibility of charging an interferometric modulator on relevant time scales, with a suitable shift in the hysteresis window. In some embodiments, a voltage shift ranging from approximately 1 to 10 volts is typically required to shift the hysteresis window to be centered on zero bias. The programming voltage required to generate a voltage shift in that range is still well below the breakdown voltage of the film (typically about 40 volts). The programming time may be tuned with optimization of the structure, such as the material and location of the charging layer. For example, a thinner tunneling dielectric layer between an electrode and the charging layer will result in a larger current density between the dielectric and the charging layer and thus a shorter programming time.

An interferometric modulator with a trappy dielectric may be programmed such that the hysteresis window is symmetrical around zero applied bias. This enables users to keep the movable layer of the interferometric modulator actuated for a sustained period without applying a non-zero bias, therefore reducing power consumption. It also addresses other issues of an interferometric modulator with a hysteresis window centered on a non-zero bias as discussed above.

Operating a Plurality of Interferometric Modulators in an Array

In some embodiments, interferometric modulators such as those described above are arranged in an array to create one or more pixels in a display module. In some embodiments, a display circuit is configured to receive and carry out instructions from a computer processor or other instruction source so that an output can be expressed on the display circuit. The instructions for the display circuit may include image data indicating which interferometric modulators should be selected for actuation in each frame. In some embodiments, the process of embedding a potential is performed for the purpose of priming the selected interferometric modulators in an array to participate in displaying a output. Accordingly, the various interferometric modulators of an array can be primed with one or more voltages or not primed at all, based on the output desired. The selection of particular interferometric modulators or pixels in an array can thus enable representation of text, images, or other indicia to be displayed on the display as an output.

When interferometric modulators that are equipped with dielectric stacks capable of holding an embedded charge are used, the instructions for the display output can cause circuitry to drive selected interferometric modulators with a relatively high voltage so that the dielectric stacks of the selected interferometric modulators are left with an embedded charge. At the same time, other interferometric modulators of the array will not be selected to receive an embedded charge. The arrangement of selected and non-selected interferometric modulators corresponds to the desired output on the display module. The process of embedding charges in selected interferometric modulators may be referred to as a "writing" stage. Those of skill in the art will appreciate that screens of different shapes and sizes will have different time requirements for the writing stage because of the number and orientation of interferometric modulators in the arrays. Writing embedded charge to the modulators may be performed with passive addressing or active addressing. Active addressing, known to those in the art, where each pixel can be individually addressed can be useful when it is desired to shift the center of the hysteresis curve all the way to zero. After each desired modulator dielectric has been charged to move the hysteresis loop, all rows and columns may be grounded. At this time, charged modulators will remain actuated and uncharged modulators will be released, displaying the desired image.

In one embodiment of instructions for an array, a single cycle of display time lasts about 10 times longer than the scan time (the time used for charging the desired modulators). In some embodiments, however, the display time can be much longer, depending on the requirements of the application and type of dielectric materials used in the dielectric stack.

The image begins to fade when the display time exceeds the characteristic charge diffusion time, which is the time it takes charge to move in or out of the dielectric stack in response to an applied electric field. Fading occurs because the potential from the reflective layer transfers to the dielectric stack. This offsets the embedded charge so that the actuation threshold rises, and the trapped charge is no longer sufficient to hold the reflective layer in a deformed state.

To reset the output, the array may be cleared of all data. This may be accomplished by applying one or more global clearing voltages to all of the interferometric modulators in the array. Once the array is cleared, it is effectively a blank slate on which to write a new output by repeating the process described above. Refreshing the output is advantageous not only to renew a display that is fading, but also in applications where text or data is updated, or in applications where a series of different images are used.

Several methods may be used to control the amount of charge stored within the dielectric stack. In the above description, one example of an electrostatic method, which may be referred to as Fowler Nordheim (FN) tunneling, has been introduced. The electrostatic method applies high fields to the device, causing electrons to tunnel from the electrode (typically a metal or semiconductor) into the conduction band of the dielectric and then accelerated towards the other electrode. Before reaching the other electrode, these electrons are trapped somewhere within the dielectric stack. The specific trapping mechanism depends on the structure of the device. An electrostatic programming simulation of a potential structure for use as a programmable MEMS capacitor is shown in FIGS. 17A-D. The structure that was used in this simulation, as shown in FIG. 11, comprises a top metal electrode, a bottom metal electrode and a charging layer that was, e.g., aluminum. The top dielectric was a 25 nm aluminum oxide layer and a 25 nm silicon dioxide layer. The simulation was based on theoretical models, well known in the fields of semiconductor device physics, and measured material properties such as current density as a function of electric field. The results of this particular simulation show, to 1st order, the transient charging behavior of this device under a −30V DC bias programming stress. The net current density onto the charging layer, and the total charge density accumulated on the charging layer is shown in FIG. 17. Also shown in FIGS. 17A-D is the net current density onto the charging layer and the individual contributions through each dielectric (the net current density onto the charging layer is a function of both trapping and de-trapping charge).

Figure 18A:
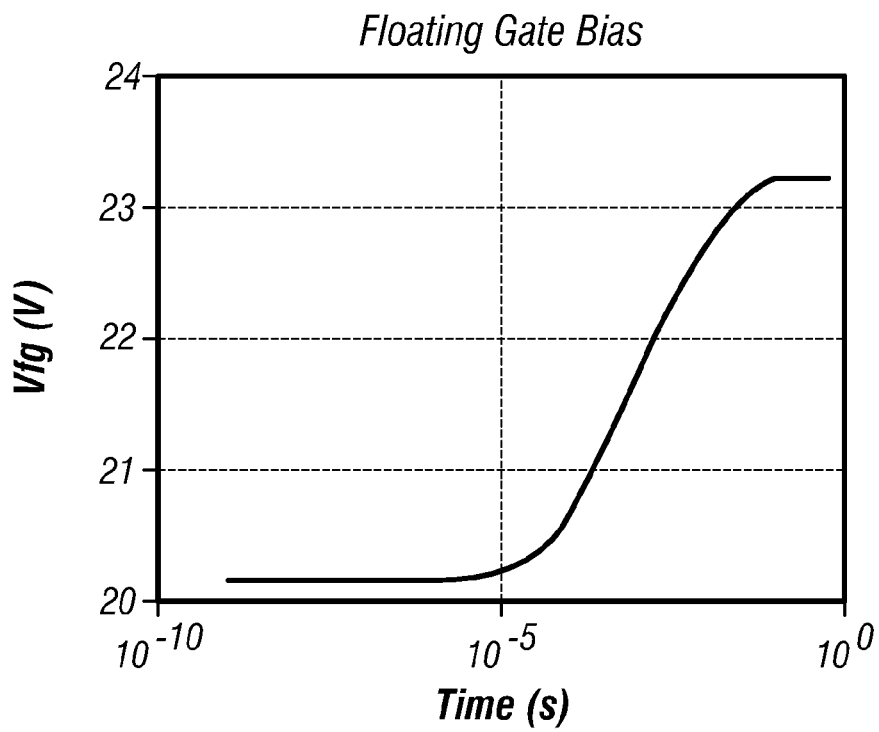
FIG. 18A-C illustrates the potential on the charging layer and the average electric fields across each dielectric in a programmable MEMS capacitor.
Figure 18B:
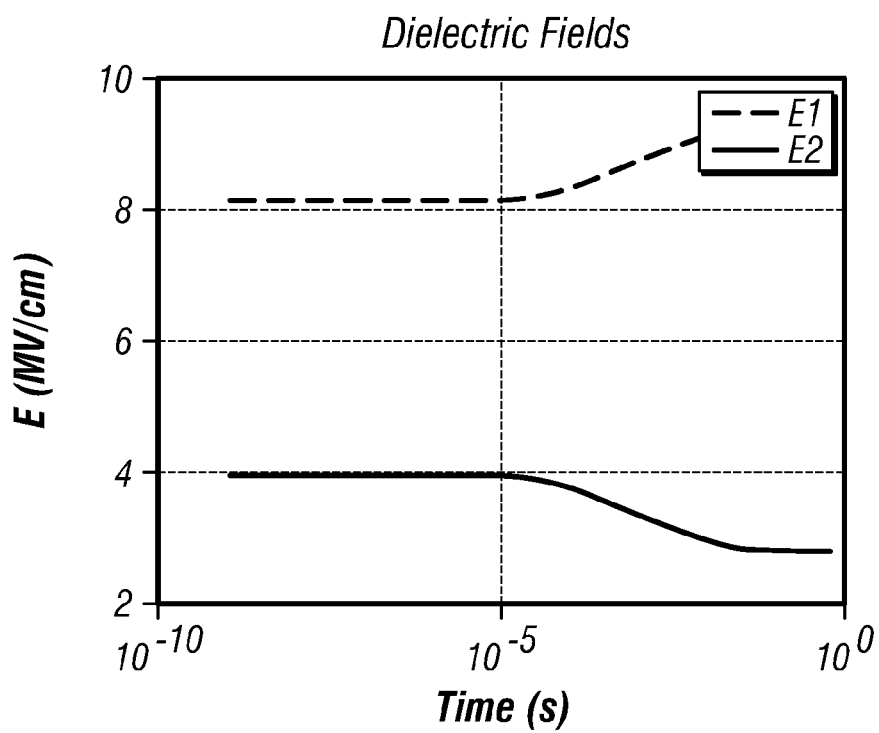
Figure 18C:
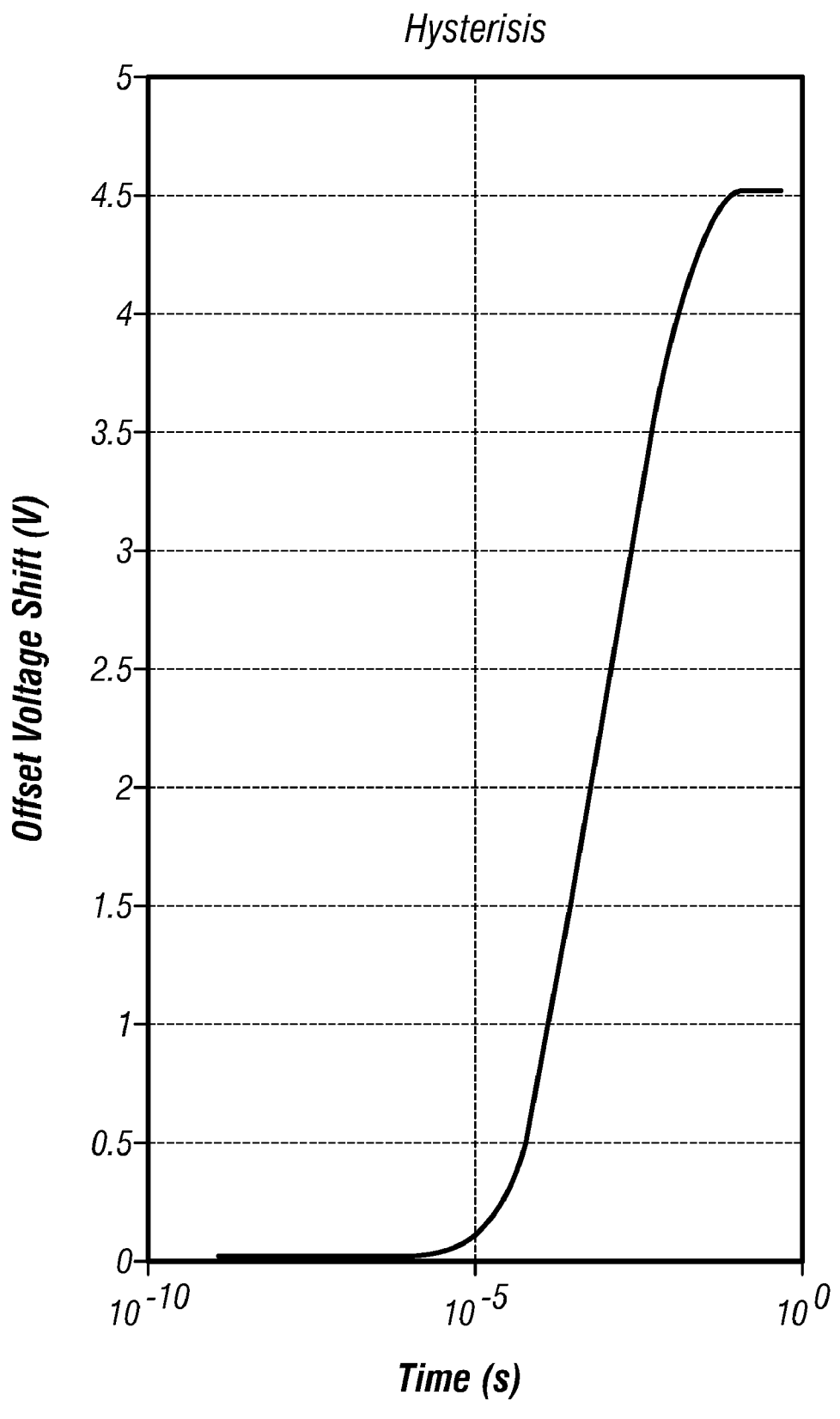

The potential on the charging layer and the average electric fields across each dielectric is shown in FIGS. 18A-C. Since the location and quantity of the trapped charge is known, the potential shift in offset voltage can be calculated, which is shown in FIGS. 18A-C. The simulation shows that with one design, the necessary charge to shift the offset voltage considerably (by e.g., several volts) can be programmed into a MEMS capacitor in a) a time frame on the order of 1 second or less, and b) at an applied bias condition that does not break down the dielectric layers.

One embodiment of a programming approach uses an optical technique called internal photoemission. This technique requires an external ultraviolet light source to excite electrons into the dielectric conduction band. Incoming high energy photons, typically 3-5 eV depending on the energy needed, get absorbed by the electrodes which then generates high energy electrons. With a small external field applied, the high energy electrons enter into the dielectric conduction band. Once in the conduction band, electrons are trapped into the same potential well as discussed above for FN tunneling. The use of a metal charging layer may result in both a) trapping of electrons from the conduction band, and b) detrapping of electrons from charging layers. For a transparent charging layer, e.g., insulator or transparent conductor electrode such as indium tin oxide, trapping of electrons onto the charging layer dominates over the detrapping because of very little photon absorption in the charging layer. One effect of using internal photoemission for controlling charge within a programmable MEMS device is that programming can be achieved at lower electric fields, therefore relaxing reliability requirements for the dielectric materials. Such a technique may be potentially favorable for programming interferometric modulator devices that are optical devices. In another embodiment, a three terminal device may be used wherein the capacitor has an electrical connection to the charging layers. The electrical connection is used for programming the capacitors with a specific amount of charge without exposing the devices to high electric fields or UV radiation.

The above described charge based hysteresis shifting has a variety of uses. For example, manufacturing of MEMS based display systems often produces devices having a range of hysteresis window positions after manufacturing, both from array to array and also between different MEMS pixels within the array. Both FN tunneling and internal photoemission may be used as a "one-time" programming event following display manufacture in order to tune the hysteresis window positions in a test and calibration procedure. In addition, the hysteresis window position of MEMS display systems can also shift with age and use. The methods described above can also be used to periodically tune the hysteresis offset voltage during operation.

A potential use of a capacitive MEMS device with programmable offset voltage control is as a MEMS based memory device. The capability of trapping and storing charge for extended periods of time can enable these devices to store information. Bits can be stored by actuating a MEMS memory element at a voltage and for a time period sufficient to shift the hysteresis window over zero volts. When the storage signal is removed, the state will be maintained. Stored data could be read out in a variety of ways. Because the capacitance of the MEMS devices described herein varies dramatically between the actuated and released states, the capacitance of a memory element could be determined with test signals. A high capacitance indicates an actuated state (e.g. binary 1), and a low capacitance indicates a released state (e.g. binary 0). In some embodiments, the state of the element could be detected optically.

Certain embodiments as described above disclose a capacitive MEMS device having a material that is located between a fixed electrode and a movable electrode and that traps and retains charges. Though the charge-trapping material is shown to be located on the fixed electrode in the examples, it will be appreciated that the charge-trapping material may be located on the movable electrode as well. These embodiments provide a programmable offset voltage control capability, enabling charge to be stored in the charge-trapping material in a controlled manner and therefore shifting the center of the hysteresis window. The actuation threshold voltage may be tunable within a specific range. Some of exemplary ranges includes, for example, 0 to 15 volts, 4 to 10 volts, 3 to 15 volts, and 0 to 2 volts. The actuation threshold voltage could be negative or positive. In another example, the actuation threshold voltage may be variably controlled between 20 and 50 volts. Other ranges may also be available depending on the particular application.

While the above detailed description has shown, described, and pointed out novel features as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A device comprising:
   an electrode;
   a movable layer extending over the electrode and forming a cavity therebetween; and
   a material coupled to one or both the electrode and the movable layer, the material comprising a dielectric layer with introduced charge trapping sites;
   wherein the movable layer is configured to move in response to an electrical potential between the electrode and at least a portion of the movable layer, the electrical potential being greater than an actuation threshold voltage, and wherein charge is transferred to or from the material to configurably change the actuation threshold voltage to a target level in response to actuation of the device.

2. The device of claim 1, wherein the material is configured to maintain enough transferred charge to change the actuation threshold voltage for a period of time exceeding 100 ms.

3. The device of claim 1, wherein the material comprises a first material and at least one other material having an electron energy band gap that is less than the electron energy band gap of the first material.

4. The device of claim 3, wherein the first material comprises at least one of silicon nitride, silicon dioxide, aluminum oxide, titanium dioxide, or transition metal oxide or silicate.

5. The device of claim 3, wherein the at least one other material comprises at least one of the following: a metal, a semi-conductor, and a dielectric material.

6. The device of claim 1, wherein the device comprises an interferometric light modulator.

7. The device of claim 6, wherein said device is configured to be connected to additional interferometric light modulators of an array.

8. The device of claim 7, wherein the array is configured to display an image.

9. The device of claim 1, wherein the material comprises regions of different electron energy band gaps.

10. The device of claim 1, wherein the device is a memory device.

11. The device of claim 1, wherein the material comprises $SiN_x$, and x is an integer greater than zero.

12. The device of claim 1, wherein the dielectric layer comprises process induced defects throughout the layer.

13. The device of claim 1, wherein the charge trapping sites are introduced at a particular depth within the dielectric layer.

14. The device of claim 13, wherein the charge trapping sites are formed by implanted dopant atoms.

15. The device of claim 1, wherein the material is coupled to the movable layer.

16. The device of claim 1, wherein the material is coupled to the electrode.

17. The device of claim 1, wherein the material comprises:
a dielectric layer; and
a layer of conductive material with the energy level in the forbidden gap of the dielectric layer.

18. The device of claim 1, wherein the device is a microelectromechanical (MEMS) device.

19. The device of claim 1, wherein the actuation threshold voltage is tunable approximately within one of the following ranges: 0 to 15 volts, 4 to 10 volts, 3 to 15 volts, 0 to 2 volts, wherein the actuation threshold voltage is either negative or positive.

20. The device of claim 1, wherein the actuation threshold voltage is tunable between about 20 and 50 volts, wherein the actuation threshold voltage is either negative or positive.

21. A device comprising:
an electrode;
a multi-layer material comprising a first material and at least one other material with an electron energy band gap that is less than the electron energy band gap of the first material; and
a movable layer extending over the surface of the multi-layer material so as to form a cavity therebetween, the movable layer being configured to contact the multi-layer material in response to an electrical potential between the electrode and at least a portion of the movable layer that is greater than an actuation threshold voltage, wherein when the movable layer contacts the multi-layer material, charge is transferred between the movable layer and the multi-layer material to configurably change the actuation threshold voltage to a target level.

22. The device of claim 21, wherein the multi-layer material is configured to maintain enough transferred charge to change the actuation threshold voltage for a period of time exceeding 100 ms after contact between the movable layer and the material is broken.

23. The device of claim 21, wherein the first material comprises a dielectric or insulator material.

24. The device of claim 21, wherein the at least one other material comprises a metal.

25. The device of claim 24, wherein said image source module comprises at least one of a receiver, transceiver, and transmitter.

26. The device of claim 21, wherein the at least one other material comprises a semi-conductor.

27. The device of claim 21, wherein the at least one other material comprises a dielectric material.

28. The device of claim 21, wherein the device comprises an interferometric light modulator.

29. The device of claim 28, wherein said multi-layer material comprises a first dielectric layer, a second dielectric layer and an additional material layer, and wherein the additional material layer has a conduction band that is offset from the conduction band of the first and/or second dielectric layers.

30. The device of claim 29, wherein the additional material layer is situated between the first and second dielectric layers, the first and second dielectric layers having a thickness of about 50 to 10000 Angstroms and the additional material layer having a thickness of about 2 to 200 Angstroms.

31. The device of claim 29, wherein the array is configured to display an image.

32. The device of claim 31, further comprising:
a processor that is in electrical communication with said array, said processor being configured to process image data; and
a memory device in electrical communication with said processor.

33. The device of claim 32, further comprising:
an image source module configured to send said image data to said processor.

34. The device of claim 32, further comprising:
an input device configured to receive input data and to communicate said input data to said processor.

35. The device of claim 31, further comprising:
a first controller configured to send at least one signal to said array; and
a second controller configured to send at least a portion of said image data to said first controller.

36. The device of claim 28, further configured to be connected to additional interferometric light modulators of an array.

37. The device of claim 21, wherein the device is a microelectromechanical (MEMS) device.

38. The device of claim 21, wherein the actuation threshold voltage is tunable approximately within one of the following ranges: 0 to 15 volts, 4 to 10 volts, 3 to 15 volts, 0 to 2 volts, wherein the actuation threshold voltage is either negative or positive.

39. The device of claim 21, wherein the actuation threshold voltage is tunable between about 20 and 50 volts, wherein the actuation threshold voltage is either negative or positive.

40. A device comprising:
means for altering a state of the device, the state being based on an actuation threshold voltage; and
means for trapping charge in a portion of the device so as to configurably change the actuation threshold voltage to a target level in response to actuation of the device, where the charge trapping means comprises a multi-layer material comprising a first material and at least one other material, the at least one other material either having an electron energy band gap that is less than the electron energy band gap of the first material or having an energy level below the conduction band of the first material.

41. The device of claim 40, wherein the means for trapping charge comprises:
an electrode;
a material coupled to one or both the electrode and the movable layer, the material being capable of trapping charge due to intrinsic electronic energy band structure and/or extrinsic defects; and
a movable layer extending over the surface of the material so as to form a cavity therebetween, the movable layer being configured to contact the material if an electrical potential between the electrode and at least a portion of the movable layer is greater than the actuation threshold voltage.

42. The device of claim 41, wherein the means for trapping charge is configured to maintain enough transferred charge to change the actuation threshold voltage for a period of time exceeding 100 ms after contact between the movable layer and the material is broken.

43. The device of claim 41, wherein the material comprises a first material and at least one other material having an electron energy band gap that is less than the electron energy band gap of the first material.

44. The device of claim 43, wherein the at least one other material comprises silicon nitride.

45. The device of claim 43, wherein the at least one other material comprises silicon dioxide.

46. The device of claim 43, wherein the at least one other material comprises a metal oxide.

47. The device of claim 43, wherein the at least one other material comprises a silicate.

48. The device of claim 43, wherein the at least one other material comprises a metal.

49. The device of claim 43, wherein the at least one other material comprises a semi-conductor.

50. The device of claim 43, wherein the at least one other material comprises a dielectric material.

51. The device of claim 41, wherein the material is a multi-layer material comprising a first insulating layer, a second insulating layer, and a charge trapping material located between the first and second insulating layer, the charge trapping material forming a potential well for charge carriers.

52. The device of claim 40, wherein the state altering means comprises a driving circuit.

53. The device of claim 40, further comprising means for modulating light.

54. The device of claim 53, wherein the modulating means comprises an interferometric cavity.

55. The device of claim 53, further comprising means for connecting the device to additional light modulating means of an array.

56. The device of claim 55, wherein the connecting means comprises row and column electrodes.

57. The device of claim 55, wherein the device is configured to display an image.

58. The device of claim 40, wherein the device is a microelectromechanical (MEMS) device.

59. The device of claim 40, wherein the actuation threshold voltage is tunable approximately within one of the following ranges: 0 to 15 volts, 4 to 10 volts, 3 to 15 volts, 0 to 2 volts, wherein the actuation threshold voltage is either negative or positive.

60. The device of claim 40, wherein the actuation threshold voltage is tunable between about 20 and 50 volts, wherein the actuation threshold voltage is either negative or positive.

61. A device comprising:
an electrode;
a multi-layer material comprising a first insulating layer, a second insulating layer, and a charge trapping material located between the first and second insulating layer, the charge trapping material forming a potential well for charge carriers; and
a movable layer extending over the surface of the multi-layer material so as to form a cavity therebetween, the movable layer being configured to contact the multi-layer material in response to an electrical potential between the electrode and at least a portion of the movable layer that is greater than an actuation threshold voltage, wherein when the movable layer contacts the multi-layer material, charge is transferred between the movable layer and the multi-layer material to configurably change the actuation threshold voltage to a target level.

62. The device of claim 61, wherein the charge trapping material has a Fermi energy level below the conduction band of the first and second insulating layers.

63. The device of claim 62, wherein the charge trapping material comprises a metal.

64. The device of claim 61, wherein the charge trapping material has an electron energy band gap that is less than the electron energy band gap of the first and second insulating layers.

65. The device of claim 64, wherein the charge trapping material comprises a dielectric material.

66. The device of claim 61, wherein the charge trapping material has a bottom of its conduction band lower than the first and second insulating layers.

67. The device of claim 61, wherein the charge trapping material has a top of its valence band higher than the first and second insulating layers.

68. A device comprising:
an electrode;
a multi-layer material comprising a first material and at least one other material with an energy level below the conduction band of the first material; and
a movable layer extending over the surface of the multi-layer material so as to form a cavity therebetween, the movable layer being configured to contact the multi-layer material in response to an electrical potential between the electrode and at least a portion of the movable layer that is greater than an actuation threshold voltage, wherein when the movable layer contacts the multi-layer material, charge is transferred between the movable layer and the multi-layer material to configurably change the actuation threshold voltage to a target level.

* * * * *